United States Patent
Dutton

(10) Patent No.: US 9,007,118 B2
(45) Date of Patent: Apr. 14, 2015

(54) CIRCUIT FOR COMBINING SIGNALS

(71) Applicant: STMicroelectronics (Research & Development) Limited, Marlow, Buckinghamshire (GB)

(72) Inventor: Neale Dutton, Edinburgh (GB)

(73) Assignee: STMicroelctronics (Research & Development) Limited, Marlow, Buckinghamshire (GB)

( * ) Notice: Subject to any disclaimer, the term of this patent is extended or adjusted under 35 U.S.C. 154(b) by 0 days.

(21) Appl. No.: 14/018,981

(22) Filed: Sep. 5, 2013

(65) Prior Publication Data
US 2014/0070867 A1    Mar. 13, 2014

(30) Foreign Application Priority Data
Sep. 10, 2012 (GB) .................................. 1216116.2

(51) Int. Cl.
  *H03K 17/90*  (2006.01)
  *G06G 7/12*  (2006.01)
  *H03K 5/1534*  (2006.01)

(52) U.S. Cl.
  CPC ................ *G06G 7/12* (2013.01); *H03K 5/1534* (2013.01)

(58) Field of Classification Search
  USPC .......................................... 327/24, 514–515
  See application file for complete search history.

(56) References Cited

U.S. PATENT DOCUMENTS

| 6,198,788 | B1 * | 3/2001 | Calamatas ..................... 377/16 |
| 7,042,250 | B1 * | 5/2006 | Ghosh et al. .................... 326/93 |
| 7,826,566 | B2 * | 11/2010 | Walker et al. ................. 375/340 |
| 2003/0156655 | A1 | 8/2003 | Hietala et al. | |

FOREIGN PATENT DOCUMENTS

| JP | S57109115 A | 7/1982 |
| JP | H05315950 A | 11/1993 |
| JP | 2000111657 A | 4/2000 |

OTHER PUBLICATIONS

UK-IPO Search Report for GB 1216116.2 dated Nov. 27, 2012 (3 pages).

* cited by examiner

*Primary Examiner* — Dinh Le
(74) *Attorney, Agent, or Firm* — Gardere Wynne Sewell LLP

(57) ABSTRACT

Signals generated by an array of photodiodes are applied to the inputs of corresponding edge detection circuits. Each edge detection circuit generates an output that changes state in response to a detected edge of the photodiode generated signal. The edge detection circuits may be formed by toggle flip-flop circuits. The outputs of the edge detection circuits are logically combined using exclusive OR logic to generate an output. The exclusive OR logic may be formed by a cascaded tree of exclusive OR circuits.

15 Claims, 13 Drawing Sheets

CIRCUIT FOR COMBINING SIGNALS

PRIORITY CLAIM

This application claims priority from Great Britain Application for Patent No. 1216116.2 filed Sep. 10, 2012, the disclosure of which is incorporated by reference.

TECHNICAL FIELD

The present invention relates to circuits for combining signals.

BACKGROUND

A complementary metal oxide semiconductor (CMOS) single photon avalanche detector (SPAD) comprises a p-n junction biased above its breakdown voltage, thus operating in Geiger mode. In this regime of operation, free carriers, such as photogenerated electron-hole pairs, can trigger an avalanche breakdown by impact ionization. SPAD photodiodes have an extremely large gain as a single electron causes a flow of charge (electron-hole pairs) proportional to the full-well capacitance and excess bias voltage of the photodiode. This typically will be in the range of tens to hundreds of thousands. The extremely large gain renders subsequent noise due to electronic processing insignificant. A single digital pulse is emitted for each absorbed photon with a timing accuracy of the order of tens to hundreds of picoseconds. These pulses can be counted or precisely timed for various purposes, such as ultra-low light imaging or time-resolved imaging. They may have applications in microscopy, range-sensing, biosensing or biomedical imaging.

One approach for merging SPAD pulses from different arrayed SPADS, or merging successive pulses from a single SPAD is to OR them together. This creates a problem of 'pile up' where one long SPAD pulse stops other SPAD pulses getting through. An approach to address this is to use a monostable circuit as a pulse shortener. However, the monostable circuit is a large and power hungry block, and a separate monostable circuit must be provided for each SPAD. So, the size and power consumption are significant issues for large SPAD arrays.

SUMMARY

According to a first aspect of the disclosure there is provided a circuit comprising: a plurality of edge detectors, each having an input for receiving an input signal and an output for outputting an output signal, and being operable to change a state of the output signal upon receipt of an input signal; and a plurality of exclusive or circuits configured to receive a plurality of output signals from the plurality of edge detectors and operable to combine the plurality of output signals into an output.

Optionally, one or more of the edge detectors comprises a toggle element.

Optionally, the toggle element comprises a T-type flip flop.

Optionally, the toggle element comprises a plurality of coupled inverters with interposing transmission gates.

Optionally, the plurality of exclusive or circuits comprise a cascaded tree of exclusive or circuits.

Optionally, the input signal is an output signal from a radiation sensitive element.

Optionally, the radiation sensitive element comprises a single photon avalanche diode.

According to a second aspect of the disclosure there is provided a proximity sensor comprising: an array of radiation sensitive elements; and a circuit comprising: a plurality of edge detectors, each having an input for receiving an input signal and an output for outputting an output signal, and being operable to change a state of the output signal upon receipt of an input signal; and a plurality of exclusive or circuits configured to receive a plurality of output signals from the plurality of edge detectors and operable to combine the plurality of output signals into an output.

According to a third aspect of the disclosure there is provided an equipment arranged for measuring distance comprising a proximity sensor comprising: an array of radiation sensitive elements; and a circuit comprising: a plurality of edge detectors, each having an input for receiving an input signal and an output for outputting an output signal, and being operable to change a state of the output signal upon receipt of an input signal; and a plurality of exclusive or circuits configured to receive a plurality of output signals from the plurality of edge detectors and operable to combine the plurality of output signals into an output.

The "equipment arranged for measuring distance" may be a portable electronic device, such as a mobile telephone for example. It may also other non-portable or non-electronic devices which incorporate circuitry according to the disclosure.

According to a fourth aspect of the disclosure there is provided a signal combination method comprising: providing a plurality of edge detectors; receiving, at an input of an edge detector, an input signal; changing a state of an output signal of the edge detector upon receipt of said input signal; and XORing a plurality of output signals from the edge detectors to provide a combined output.

The step of "XORing a plurality of output signals" means performing an "exclusive or" logical operation between the signals, and may be performed by circuitry configured to provide such a logical operation.

Optionally, the method comprises the steps of outputting signals from an array of radiation sensitive elements, and providing the output signals as the inputs to the edge detectors.

Optionally, the radiation sensitive elements comprise single photon avalanche diodes.

Methods of detecting a signal, and various associated methods such as proximity sensing may also incorporate the method of the fourth aspect as a component part thereof.

BRIEF DESCRIPTION OF THE DRAWINGS

The disclosure will now be described, by way of example only, with reference to the accompanying drawings, in which.

DETAILED DESCRIPTION OF THE DRAWINGS

Figure 1:
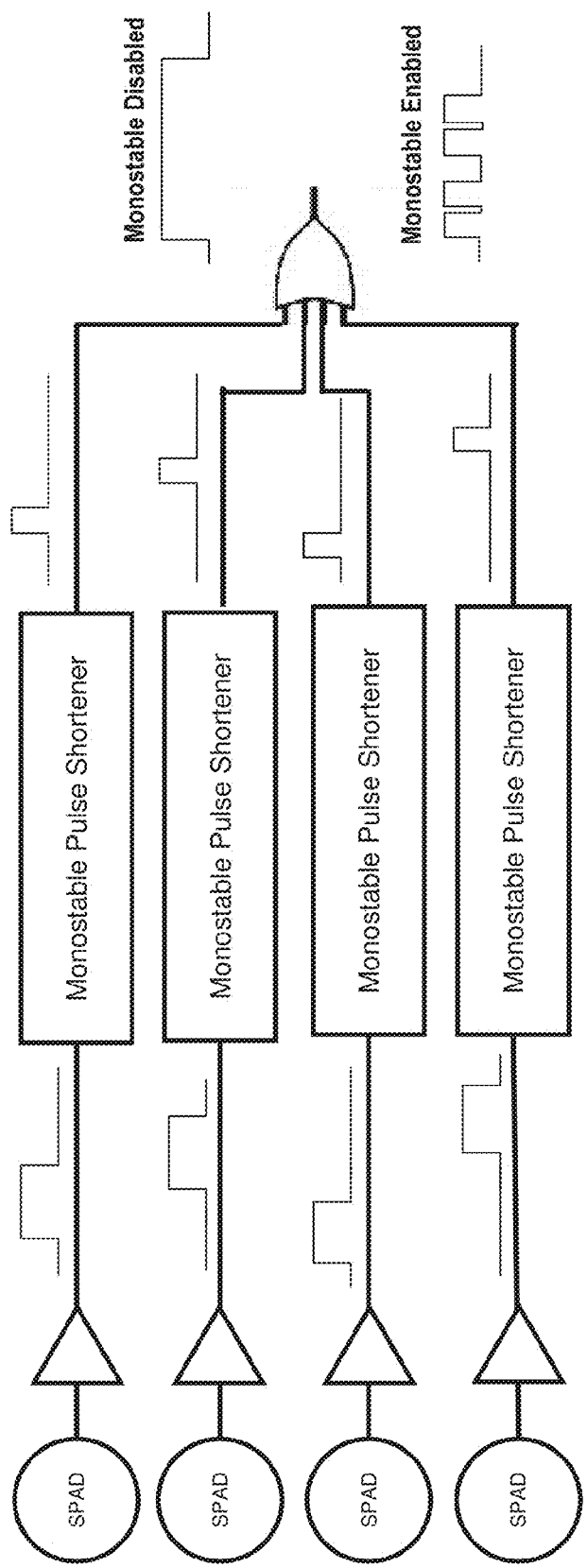
FIGS. 1 and 2 illustrate an approach for combining SPAD signals using a SPAD array with buffered outputs.
Figure 2:
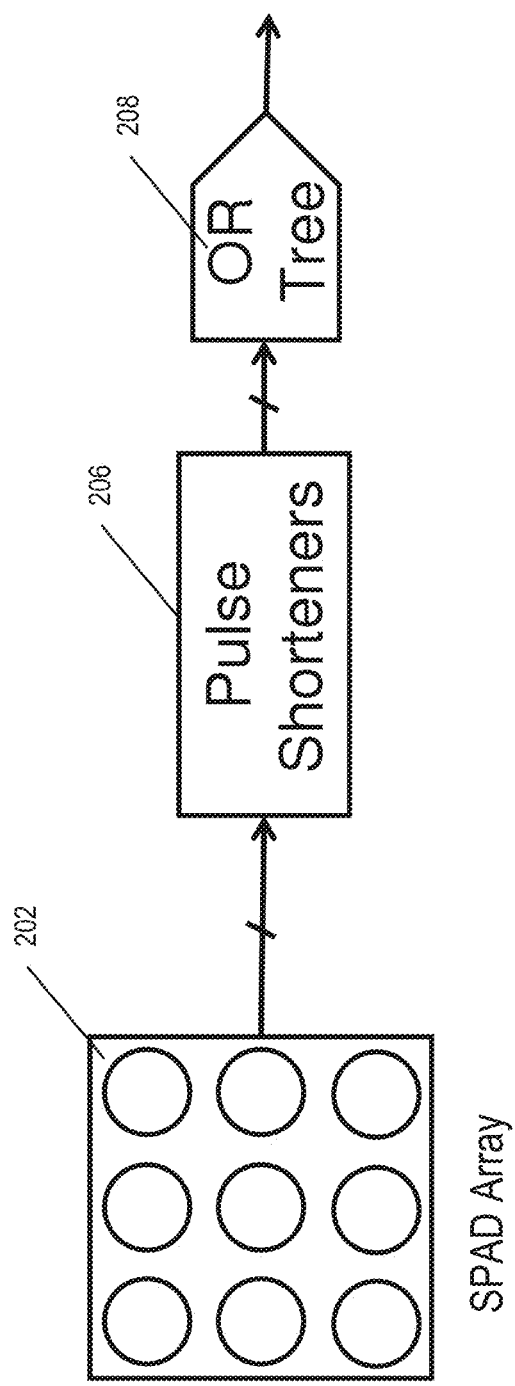

One approach for merging SPAD pulses is to OR them together. This is illustrated in FIG. 1. This approach includes monostable circuits as pulse shorteners in order to prevent "pile up", where one long SPAD pulse stops other SPAD pulses getting through. A similar approach is also represented in FIG. 2, using a SPAD array 202 with buffered outputs, a Pulse Shortening/Shaping Circuit 206 and a Cascaded OR tree 208.

Figure 3:
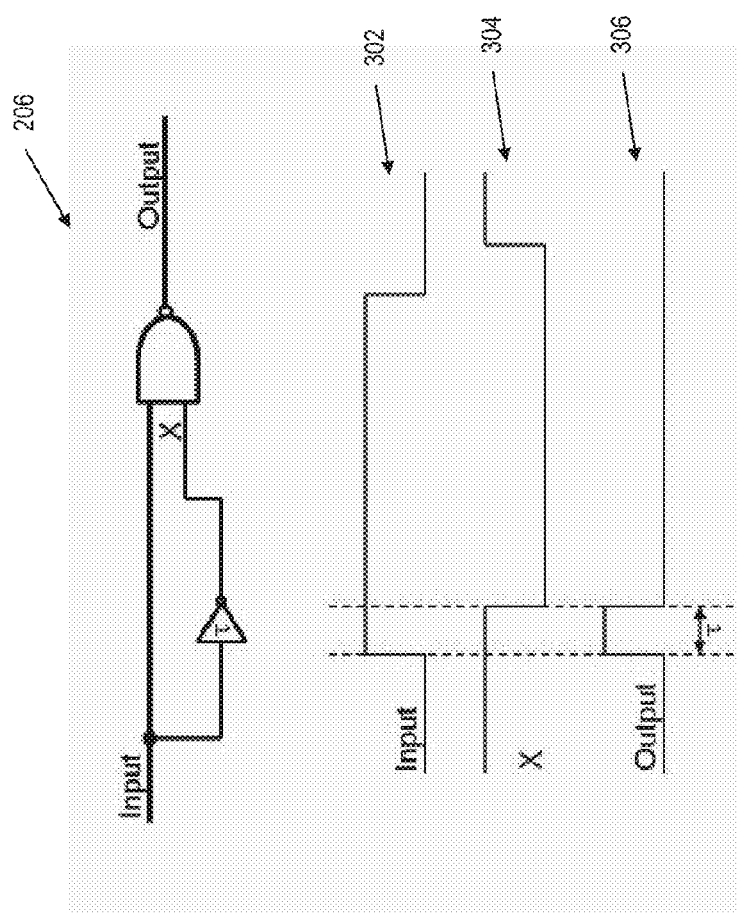
FIG. 3 illustrates a Pulse Shortening/Shaping Circuit.

FIG. 3 illustrates an example Pulse Shortening/Shaping Circuit 206, together with a timing diagram showing its operation. The timing diagram shows the input 302 is a SPAD pulse of approximately 6-10 ns. The signal at node X is shown at 304. The output is a reduced width pulse τ, typically 3 ns but which varies with temperature, operating voltage and over process corners.

Figure 4:
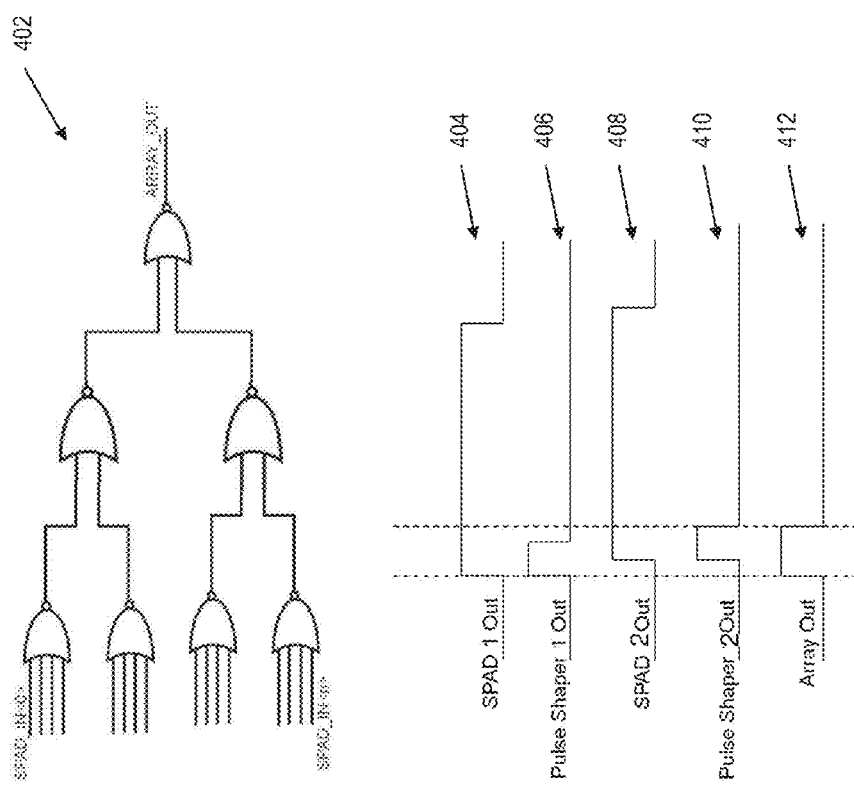
FIG. 4 illustrates an OR tree and its timing diagram.

FIG. 4 illustrates an OR tree and its timing diagram. The OR tree 402 will be "locked up" for the duration of the pulse shaped pulse (~3 ns). In the timing diagram example signals are shown: SPAD 1 Out 404, Pulse Shaper 1 Out 406, SPAD 2 Out 408, Pulse Shaper 2 Out 410. The timing diagram also shows the OR tree array output 412. Any other SPADs firing during this time will lengthen the OR tree output pulse. For high precision timing or counting applications, there is no way to determine whether this represents one or more counts.

Figure 5:
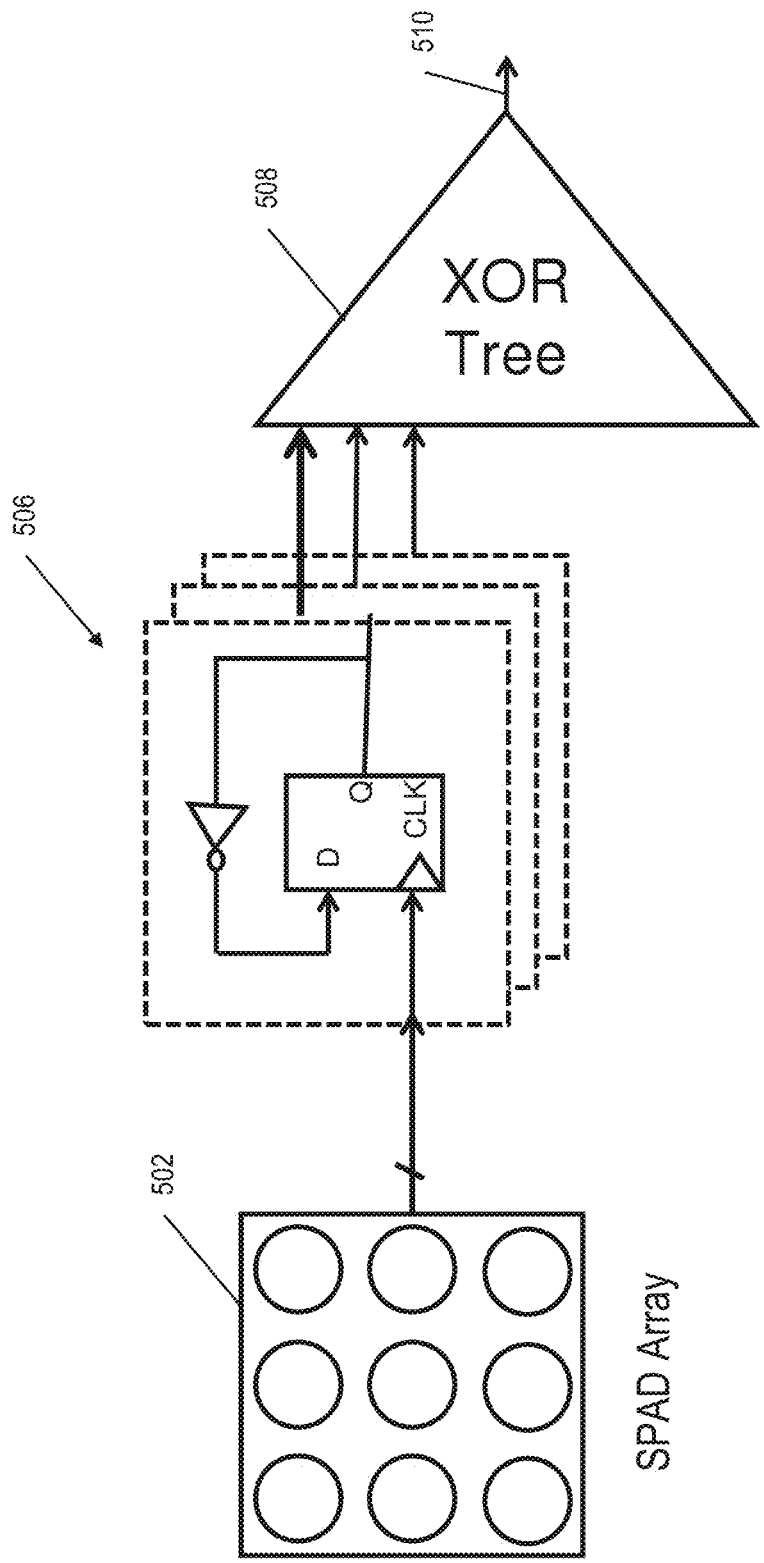
FIG. 5 illustrates an approach for combining SPAD signals according to an embodiment of the present disclosure.
Figure 11:
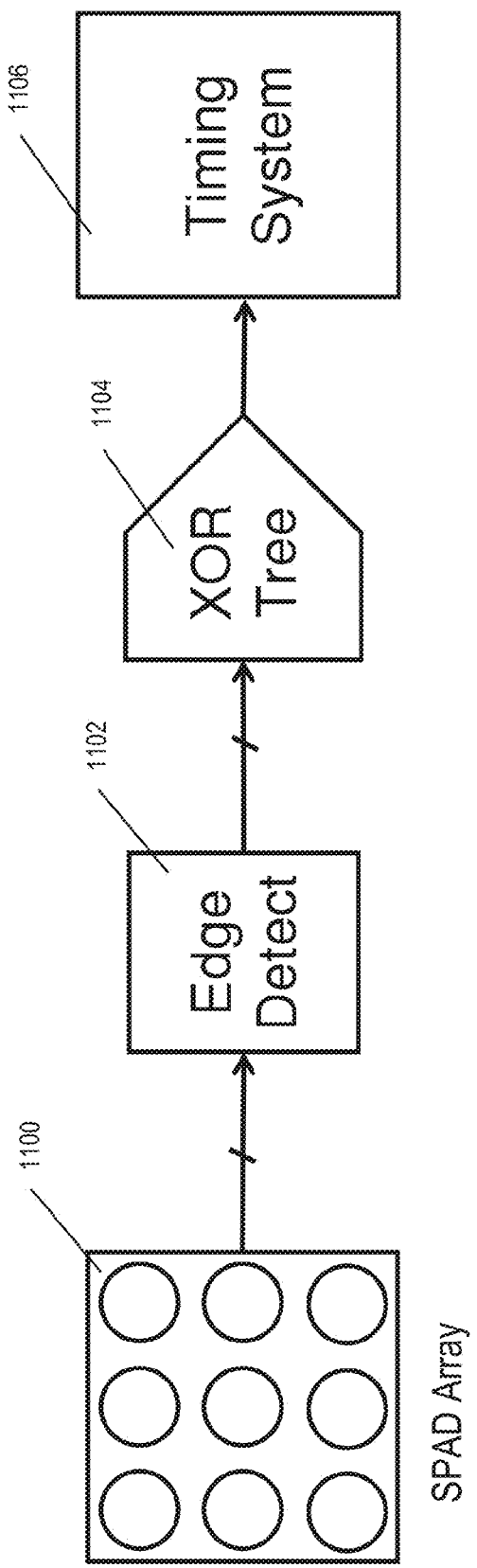
FIG. 11 illustrates a general system diagram according to the disclosure.

FIG. 5 illustrates an embodiment of the present disclosure comprising a SPAD array 502 with buffered outputs, a plurality of edge detectors 506 (one being provided for each SPAD input) and a cascaded XOR tree 508. The output of the XOR tree 510 goes to a timing system. A timing system can be seen in the top level system diagram of FIG. 11, which shows a SPAD array 1100, edge detect 1102, XOR tree 1104 and timing system 1106.

The edge detectors may generally be referred to as "edge detection means". The edge detectors may comprise a rising edge detection circuit or a falling edge detection circuit. One example of an edge detector that is suitable for implementation of the disclosure is a toggle element. A toggle element comprises a clock input, the input to which triggers a change of state of the output of the toggle element. An example of a toggle element that can be used with the present disclosure is a T-type flip flop, as illustrated at 506 in the example embodiment of FIG. 5.

Figure 6:
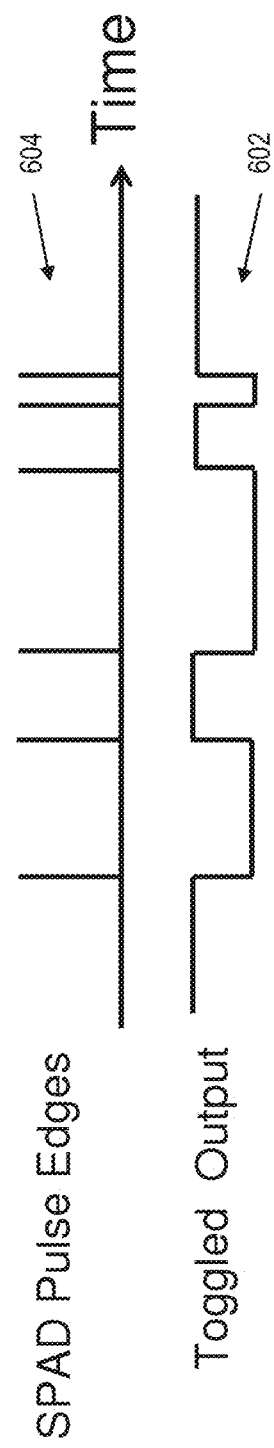
FIG. 6 is a timing diagram showing a toggled output from combined SPAD inputs provided by the embodiment of FIG. 5.

FIG. 6 is a timing diagram showing the toggled output 602 from the combined SPAD inputs 604, provided by the circuit of FIG. 5. The output 602 toggles on every positive SPAD pulse edge 604.

Figure 7:
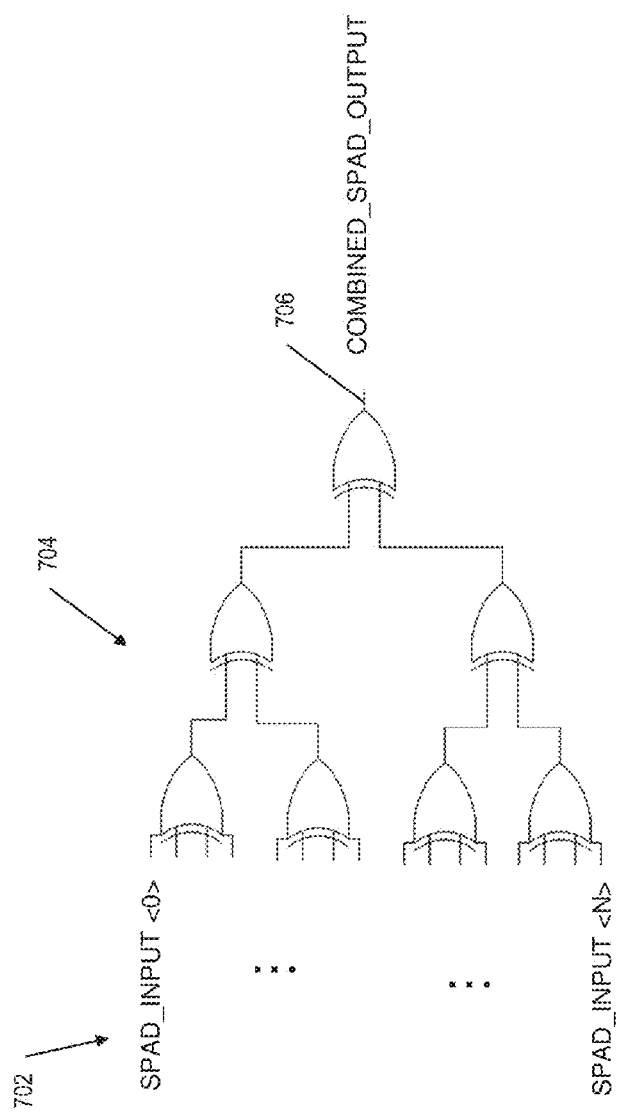
FIG. 7 illustrates a cascaded XOR tree, suitable for use as part of the embodiment of FIG. 5.

FIG. 7 illustrates an example of a cascaded XOR tree that may be used with the circuit of FIG. 5. The size of the tree depends on the size of the SPAD array. For a very small array, the "tree" could in fact comprise a single XOR gate. Every SPAD pulse received at the inputs 702 toggles its respective T-type flip-flop in the tree 704. Any change of state to any of the inputs will flip the XOR tree output 706.

Figure 8:
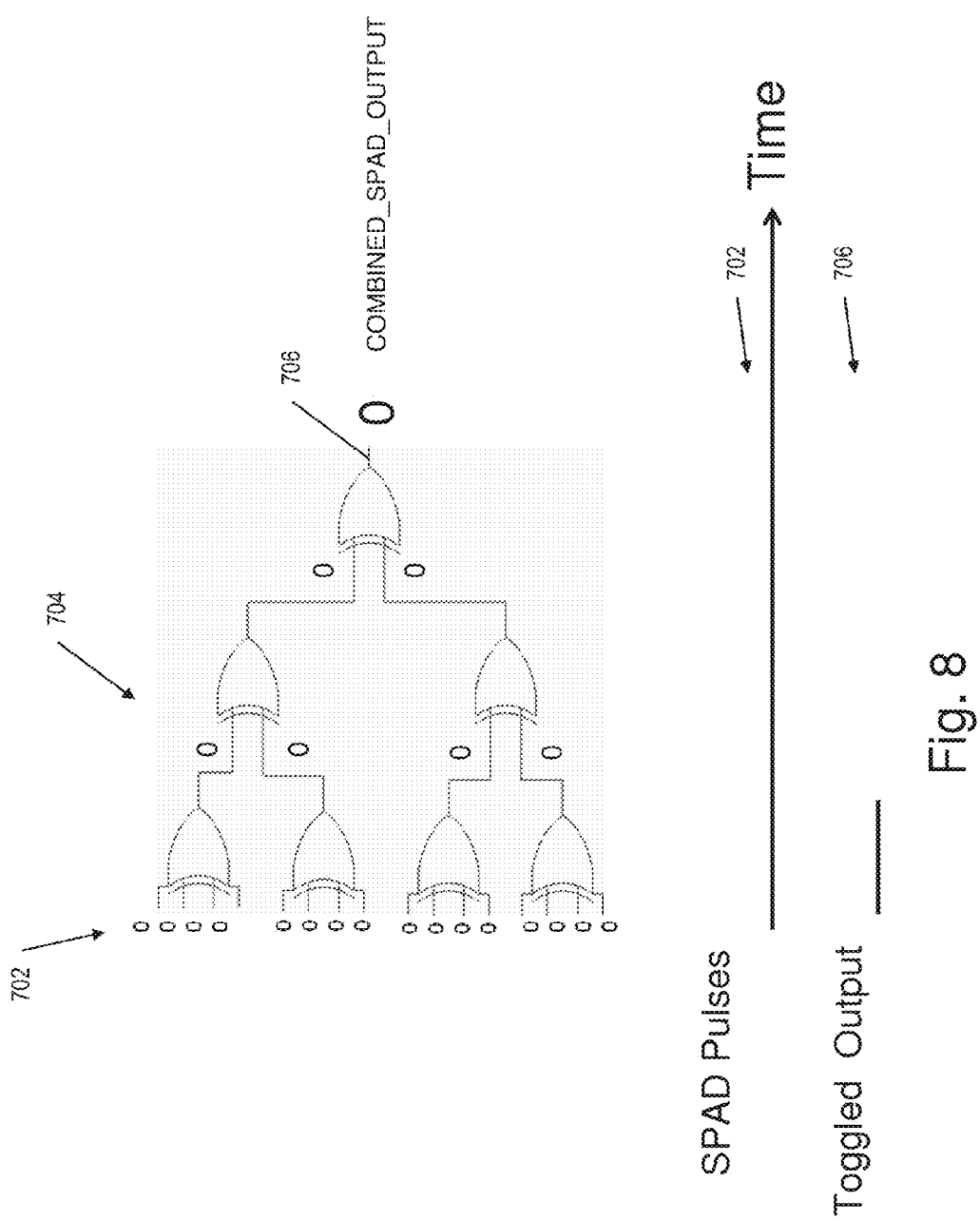
FIGS. 8 to 10 illustrate the operation of the cascaded XOR tree of FIG. 7.
Figure 9:
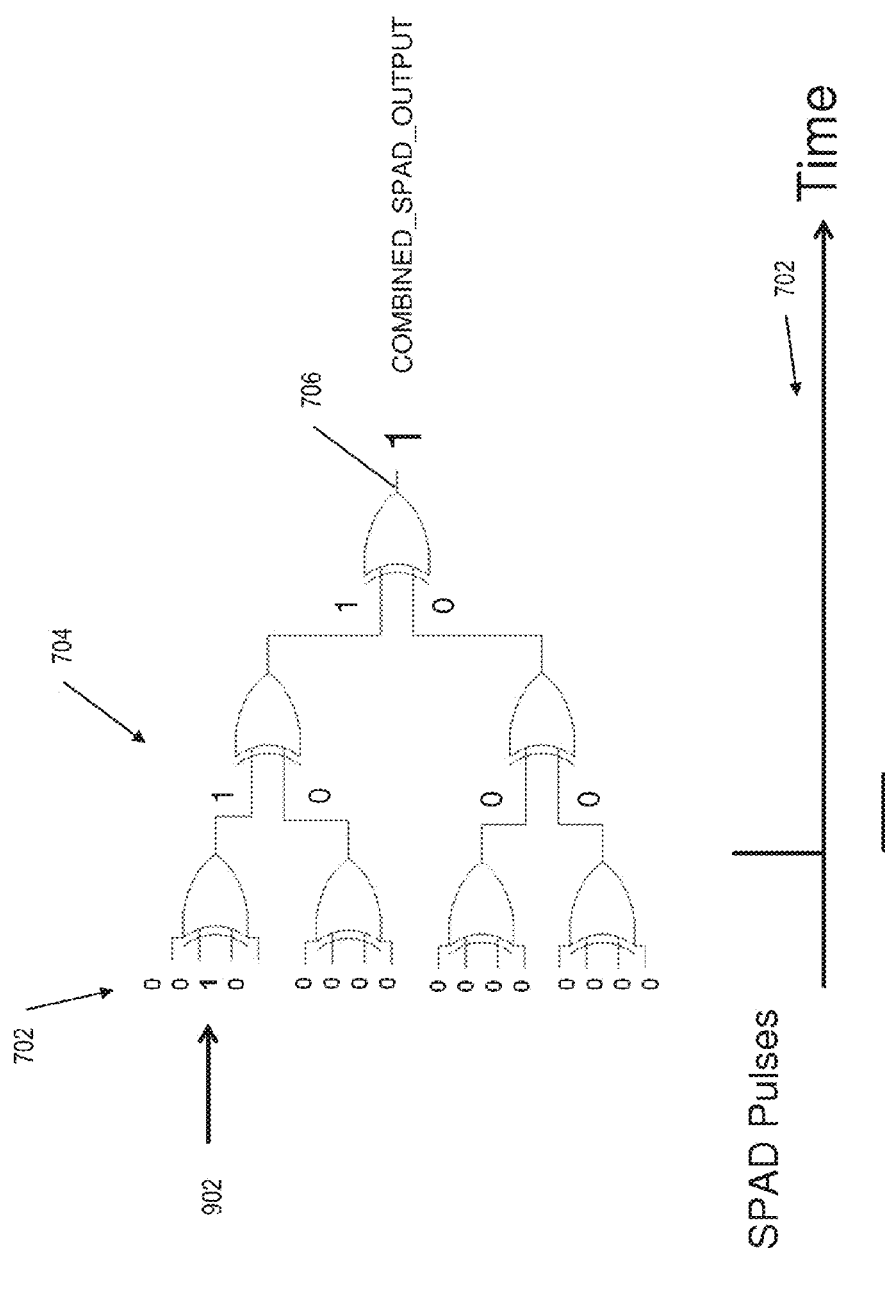
Figure 10:
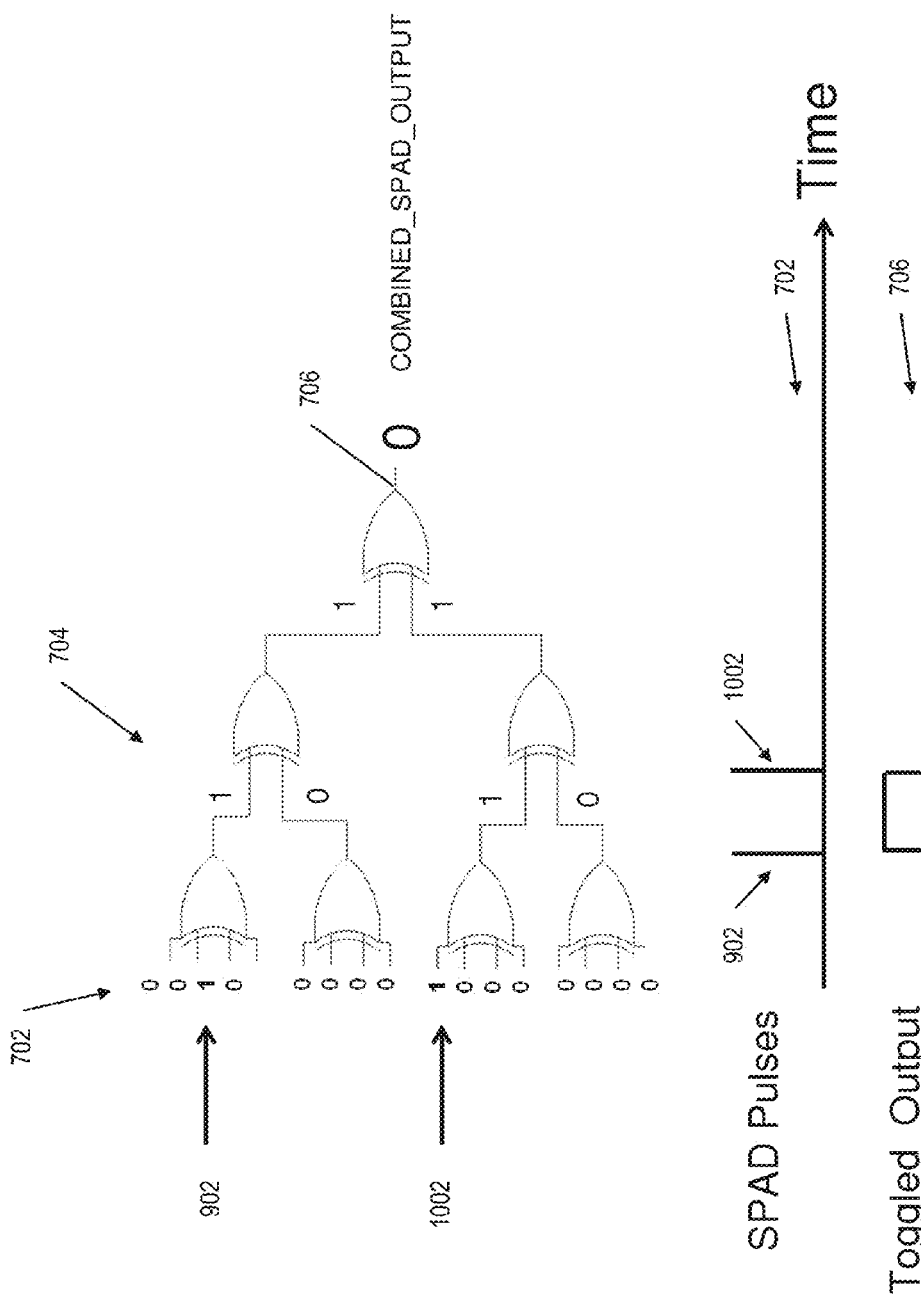

FIGS. 8 to 10 illustrate the operation of the cascaded XOR tree 704, in accordance with an embodiment of the present invention. In FIG. 8, all the inputs are at zero. In FIG. 9, one input 902 is 1. In FIG. 10, two inputs 1002 and 1004 are 1. The effect of the SPAD pulses 702 on the toggled output 706 is shown in the timing diagram.

This method of encoding timing information on both positive and negative going edges of a pulse helps solve or substantially reduce the effect of the problem of pile up that is explained above, and do so in a manner that is space and power efficient as monostable circuits are not required to provide pulse shortening. In addition, the circuit provides a very high throughput timing converter, as the frequency of operation is not limited by a monostable operation but instead only by the maximum operating frequency of the circuit components used.

To give an indication of the speed up achieved—a very fast time to digital converter (TDC) might produce 300 MS/s (M Samples per sec), where the majority of converters operate at 10-100 MS/s because the rest of the system cannot cope with this amount of data throughput. This disclosure can enable throughput in the order of tens of GS/s.

Furthermore, pulse shapers are highly sensitive to process, voltage and temperature variations, and so these problems are also avoided by avoiding use of pulse shapers.

The disclosure can be of use in various practical applications, including:
  Medical Imaging—PET Scanners
  High end Depth Profiling/Laser Rangefinding—for industrial, construction, defence applications
  Low cost rangefinders for proximity detection in consumer applications (mobile telephones, etc)
  3D Imaging—LIDAR (Radar using Light) scanning methods of 3D Depth imaging could be greatly sped up by use of this disclosure
  Biological imaging such as Fluorescence Lifetime Imaging Microscopy (FLIM) or Raman Spectrometry could be greatly sped up allowing for real-time/faster system operation.

The circuit described above provides for a method of combining signals. That method may itself be part of a more general method of detecting signals, which may be applicable in various methods for the applications listed above.

While this detailed description has set forth some embodiments of the present invention, the appended claims cover other embodiments of the present invention which differ from the described embodiments according to various modifications and improvements.

For example, it is to be appreciated that a toggle flip-flop may be constructed in numerous ways, such as but not limited to:
  A JK flip-flop.
  An edge-triggered D flip-flop with its D input fed from its inverted output.
  Coupled inverters with transmission gates interposed between.

Figure 12:
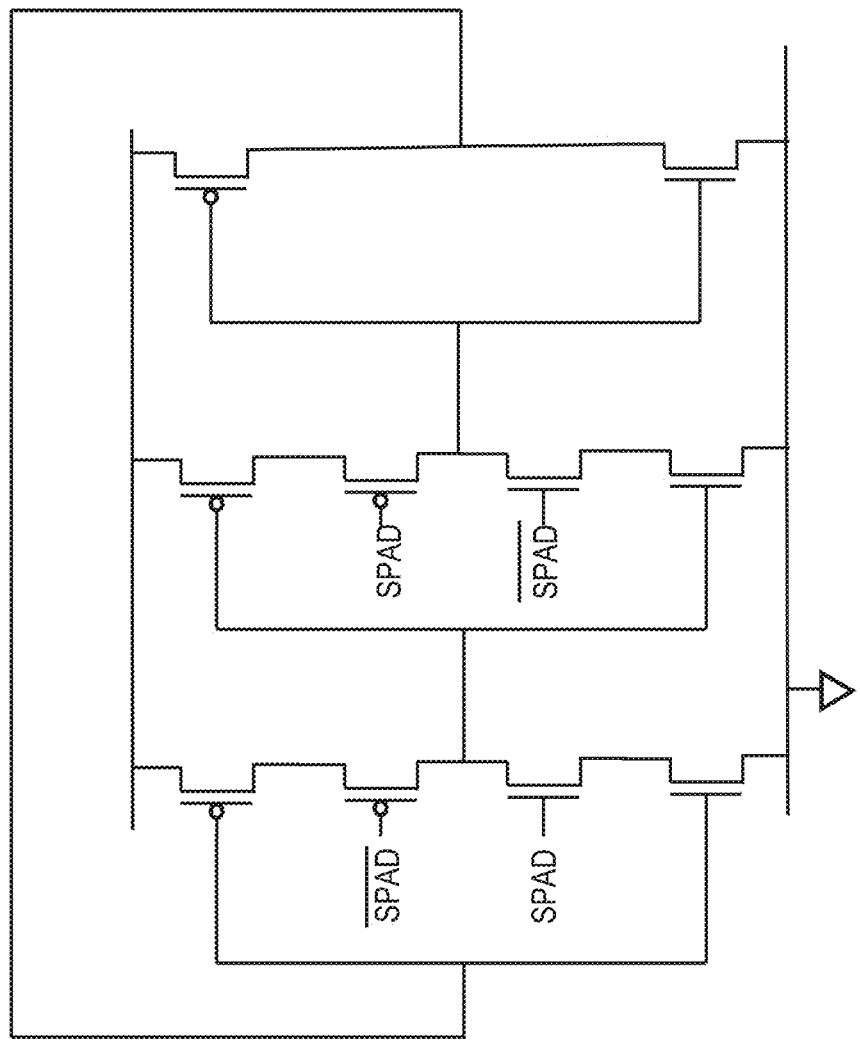
FIG. 12 illustrates a toggle element circuit comprising three inverters with transmission gates between them, which may be used as an edge detector in the system of the disclosure.
Figure 13:
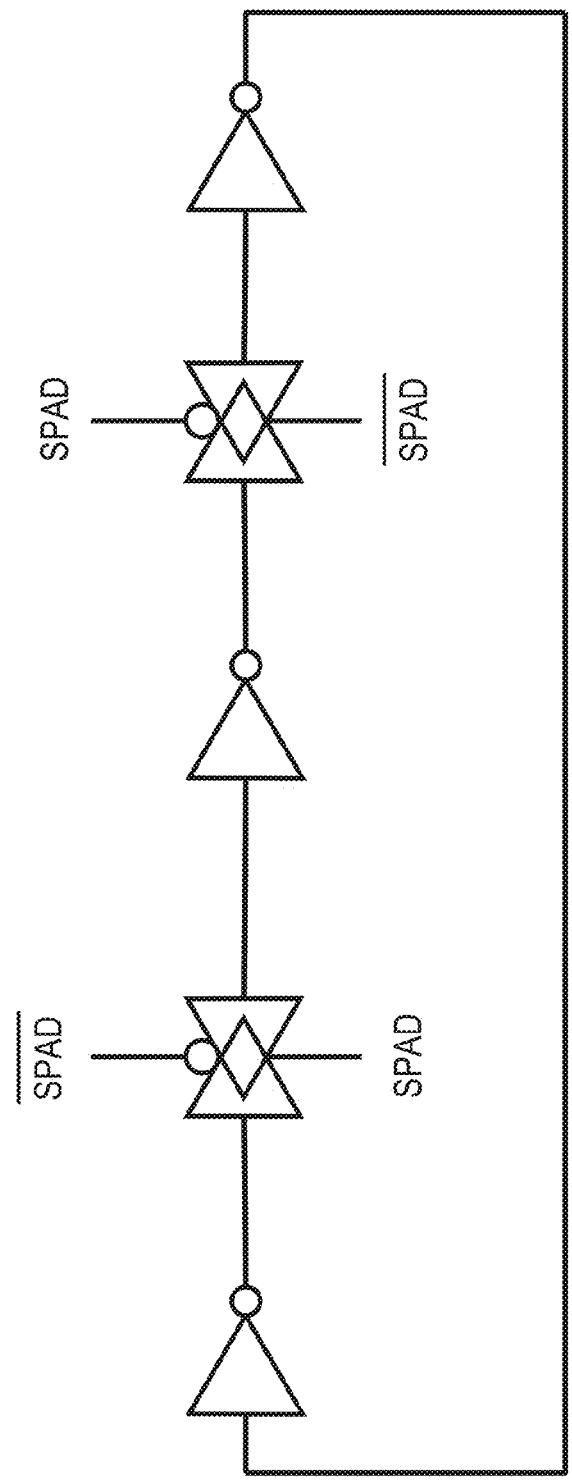
FIG. 13 is a diagrammatic version of the toggle element circuit of FIG. 12.

FIG. 12 illustrates an example of a toggle flip flop of the type comprising coupled inverters (in this case, three) with transmission gates between them, as implemented in CMOS. The circuit of FIG. 12 may be used as a toggle element type edge detector in any embodiment of the disclosure. FIG. 13 is a diagrammatic version of the circuit of FIG. 12.

Although the embodiments have been described with reference to SPADs, it is to be appreciated that the principles of the disclosure could apply to other radiation sensitive elements, such as other types of avalanche diodes, photodiodes, photogates and so on.

What is claimed is:

1. A circuit comprising:
   a plurality of edge detectors each having an input configured to receive an input signal and an output configured to output a first output signal, each edge detector operable to change a state of the first output signal in response to an edge of the input signal; and
   a plurality of exclusive OR circuits configured to receive a plurality of first output signals from the plurality of edge detectors and operable to combine the plurality of first output signals to generate a second output signal.

2. The circuit of claim 1, wherein one or more of the edge detectors comprises a toggle element.

3. The circuit of claim 2, wherein the toggle element comprises a T-type flip flop.

4. The circuit of claim 2, wherein the toggle element comprises a plurality of coupled inverters with interposing transmission gates.

5. The circuit of claim 1, wherein the plurality of exclusive OR circuits comprise a cascaded tree of exclusive OR circuits.

6. The circuit of claim 1, wherein the input signal is a signal output from a radiation sensitive element.

7. The circuit of claim 6, wherein the radiation sensitive element comprises a single photon avalanche diode.

8. A proximity sensor, comprising:
   an array of radiation sensitive elements; and
   a circuit comprising:
      a plurality of edge detectors each having an input configured to receive an input signal and an output configured to output a first output signal, each edge detector operable to change a state of the first output signal in response to an edge of the input signal; and
      a plurality of exclusive OR circuits configured to receive a plurality of first output signals from the plurality of edge detectors and operable to combine the plurality of first output signals to generate a second output signal.

9. The sensor of claim 8, wherein each radiation sensitive element comprises a single photon avalanche diode.

10. The sensor of claim 8, wherein each edge detector comprises a toggle flip-flop.

11. The sensor of claim 8, wherein the plurality of exclusive OR circuits comprises a cascaded tree of exclusive OR circuits.

12. A signal combination method, comprising:
    receiving a plurality of input signals;
    detecting an edge of each of said plurality of input signals;
    changing a state of a corresponding first output signal in response to the detected edge of said input signal; and
    exclusive ORing a plurality of said corresponding first output signals to provide a combined second output signal using a plurality of exclusive OR circuits.

13. The method of claim 12, further comprising outputting signals from an array of radiation sensitive elements, each radiation sensitive element output signal comprising one of said plurality of input signals.

14. The method of claim 13, wherein the radiation sensitive elements comprise single photon avalanche diodes.

15. The method of claim 12, wherein exclusive ORing comprises combining the plurality of said corresponding first output signals in a cascaded exclusive OR tree.

* * * * *